(12) United States Patent
Ramey et al.

(10) Patent No.: US 9,835,669 B2
(45) Date of Patent: Dec. 5, 2017

(54) AUTOMATIC DATA BUS WIRE INTEGRITY VERIFICATION DEVICE

(71) Applicant: The Boeing Company, Chicago, IL (US)

(72) Inventors: Sean M. Ramey, Lynnwood, WA (US); Jeffrey A. Lawrence, Snohomish, WA (US); Enoch E. McDowell, Everett, WA (US); John A. Sekora, Mukilteo, WA (US); Edgar L. von Trotha, III, Snohomish, WA (US); David E. Lawrence, Everett, WA (US)

(73) Assignee: The Boeing Company, Chicago, IL (US)

( * ) Notice: Subject to any disclaimer, the term of this patent is extended or adjusted under 35 U.S.C. 154(b) by 357 days.

(21) Appl. No.: 14/577,151

(22) Filed: Dec. 19, 2014

(65) Prior Publication Data

US 2016/0178683 A1    Jun. 23, 2016
US 2017/0160332 A9    Jun. 8, 2017

(51) Int. Cl.
*G01R 31/02* (2006.01)

(52) U.S. Cl.
CPC ................. *G01R 31/025* (2013.01)

(58) Field of Classification Search
CPC .. G01R 31/025; G01R 31/006; G01R 31/021; G01R 31/005; G01R 31/008; G01R 31/026; G01R 31/024; G01R 31/08; G01R 31/10; G01R 31/2853; G01R 31/31855; G06F 11/3013; G06F 11/221; G06F 11/349; G06F 11/0736; G06F 11/0739;
(Continued)

(56) References Cited

U.S. PATENT DOCUMENTS

| | | | |
|---|---|---|---|
| 6,502,212 B1 * | 12/2002 | Coyle | G06F 11/221 710/15 |
| 7,154,278 B2 * | 12/2006 | Scholl | G01R 31/006 324/510 |
| 8,094,688 B2 * | 1/2012 | Kishigami | H04L 1/24 370/245 |
| 2002/0194547 A1 * | 12/2002 | Christensen | G06F 11/0736 714/43 |
| 2005/0134163 A1 | 6/2005 | Voorhees et al. | |
| 2009/0183033 A1 * | 7/2009 | Ando | H04L 43/0823 714/43 |

(Continued)

OTHER PUBLICATIONS

Novak, J., et al.; "Automated Testing of Electronic Control Units Compatibility in Vehicle CAN Networks," IEEE ISIE, Jun. 20-23, 2005, pp. 1423-1428.

(Continued)

*Primary Examiner* — Arleen M Vazquez
*Assistant Examiner* — Lee Rodak
(74) *Attorney, Agent, or Firm* — Charles L. Moore; Moore & Van Allen PLLC (57) ABSTRACT

A device for verifying wire connectivity of a bus may include a bus connector configured to connect to a bus comprising a plurality of wires and measurement circuitry configured to perform a verification test on each wire of the bus. The verification test of each wire may include connecting a wire under test in a predetermined configuration relative to the other wires for performing the verification test and measuring a value of an electrical parameter associated with the wire under test. The verification test may also include comparing the value of the measured electrical parameter associated with the wire under test to an expected value of the electrical parameter. The wire under test passes the verification test in response to the measured value of the electrical parameter corresponding substantially to the expected value of the electrical parameter.

20 Claims, 10 Drawing Sheets

(58) Field of Classification Search
CPC .............. G06F 11/079; G06F 11/0793; G06F 11/2007; G06F 11/3041; G06F 11/3055; G06F 17/5036; G06F 2217/82; H04L 2012/40215; B60R 16/0231; B60R 16/0232; G05B 2219/25032
USPC ....... 324/500, 503, 508, 509, 510, 511, 512, 324/513, 522, 523, 525, 527, 528, 538, 324/605, 66, 537, 55, 600, 649, 691, 713, 324/718, 719, 756.01, 756.02, 762.02, 324/762.03, 762.05; 370/241, 242, 245, 370/252; 714/43, 40, 25, 1; 702/57, 58, 702/59

See application file for complete search history.

(56) References Cited

U.S. PATENT DOCUMENTS

| | | |
|---|---|---|
| 2012/0136599 A1 | 5/2012 | Inui |
| 2013/0049767 A1 | 2/2013 | King et al. |
| 2014/0005881 A1* | 1/2014 | Hardesty ................. F02D 41/22 701/32.8 |
| 2015/0346259 A1* | 12/2015 | Jiang ................... H04L 43/0811 324/538 |

OTHER PUBLICATIONS

European Patent Office; Office Action for European Patent Application No. 15201087.2 dated Apr. 20, 2016, 7 Pages.

\* cited by examiner

| PIN | 1 | 2 | 3 | 4 | 5 | 6 | 7 | 8 | 9 | BINARY | DECIMAL |
|---|---|---|---|---|---|---|---|---|---|---|---|
| RDC-1 | 0 | 0 | 0 | 0 | 0 | 0 | 1 | 1 | 1 | 000011111 | 63 |
| RDC-2 | 0 | 1 | 1 | 0 | 0 | 1 | 1 | 1 | 1 | 011001111 | 207 |
| RDC-3 | 1 | 0 | 0 | 0 | 0 | 1 | 1 | 1 | 1 | 100001111 | 271 |
| RDC-4 | 1 | 0 | 0 | 0 | 1 | 0 | 1 | 1 | 1 | 101010111 | 343 |
| RDC-5 | 0 | 0 | 1 | 0 | 0 | 0 | 1 | 1 | 1 | 001010111 | 151 |
| RDC-6 | 0 | 1 | 1 | 0 | 0 | 1 | 1 | 1 | 1 | 001100111 | 103 |
| RDC-7 | 1 | 1 | 0 | 1 | 0 | 1 | 0 | 1 | 1 | 110100111 | 423 |
| RDC-8 | 0 | 0 | 1 | 0 | 1 | 0 | 1 | 1 | 1 | 000101111 | 91 |
| RDC-9 | 1 | 1 | 0 | 0 | 1 | 1 | 0 | 1 | 1 | 110011011 | 411 |
| RDC-10 | 0 | 0 | 1 | 0 | 1 | 0 | 1 | 1 | 1 | 001010111 | 363 |
| RDC-11 | 0 | 1 | 0 | 1 | 0 | 1 | 0 | 1 | 1 | 010101011 | 171 |
| RDC-12 | 0 | 0 | 1 | 1 | 1 | 0 | 0 | 1 | 1 | 011100011 | 243 |
| RDC-13 | 1 | 1 | 1 | 0 | 0 | 1 | 1 | 1 | 1 | 100110111 | 464 |
| RDC-14 | 1 | 1 | 0 | 0 | 0 | 0 | 1 | 1 | 1 | 110000111 | 451 |
| RDC-15 | 0 | 0 | 0 | 0 | 0 | 0 | 0 | 1 | 1 | 000000011 | 3 |
| RDC-16 | 0 | 1 | 1 | 0 | 1 | 1 | 1 | 0 | 0 | 011101100 | 232 |
| RDC-17 | 1 | 0 | 0 | 1 | 1 | 1 | 0 | 0 | 0 | 100111000 | 316 |
| RDC-18 | 1 | 1 | 0 | 0 | 1 | 1 | 1 | 0 | 0 | 110011100 | 460 |
| RDC-19 | 0 | 0 | 0 | 0 | 0 | 0 | 1 | 1 | 0 | 000001100 | 12 |
| RDC-20 | 1 | 1 | 0 | 0 | 1 | 0 | 1 | 0 | 0 | 110010100 | 404 |
| RDC-23 | 0 | 1 | 0 | 1 | 0 | 0 | 1 | 0 | 0 | 010100100 | 164 |

AUTOMATIC DATA BUS WIRE INTEGRITY VERIFICATION DEVICE

FIELD

The present disclosure relates to verifying integrity of electrical wiring, and more particularly to a device and method for automatically verifying the wire integrity of a bus, such as a controller area network (CAN) bus or other electrical connections on an aircraft or other vehicle.

BACKGROUND

Modern aircraft are complex devices that include multiple different systems. Many of these systems may be electrically interconnected for transmitting data and for controlling the different systems. The electrical interconnections between aircraft systems may include multiple data buses with hundreds of wire interconnections. For example, a Boeing 787 currently has 134 controller area network (CAN) buses that interconnect through 21 bus gateways or remote data concentrators (RDC) representing hundreds of wire connections. Wire connectivity is currently solely determined by Airplane (AP) system functionality after installation and power on. CAN line replaceable units (LRUs) are turned on and the maintenance system is observed for any communication faults. CAN is a robust communication protocol and CAN LRUs can still maintain communication through several types of build errors. By design, the CAN bus is fault tolerant making it difficult to detect build errors using system functionality. Therefore, hard or intermittent faults can be missed by current verification procedures during installation. Additionally, individual wire checks are extremely time consuming and faults can still be missed if subtle faults on the CAN bus are intermittent. Accordingly, there is a need for a device for reliably verifying bus wire integrity that can be done efficiently, with minimal cost and does not require a specially trained person to observe the bus for the subtle failures.

SUMMARY

In accordance with an embodiment, a device for verifying wire integrity of a bus may include a bus connector configured to connect a bus comprising a plurality of wires. The device may also include measurement circuitry configured to perform a verification test on selected wires of the bus. The verification test of the selected wires may include connecting a selected wire under test in a predetermined configuration relative to the other wires for performing the verification test and measuring a value of an electrical parameter associated with the selected wire under test. The verification test may also include comparing the value of the measured electrical parameter associated with the selected wire under test to an expected value of the electrical parameter. The selected wire under test passes the verification test in response to the measured value of the electrical parameter corresponding substantially to the expected value of the electrical parameter.

In accordance with another embodiment, a device for verifying wire integrity of a bus may include a bus connector configured to connect to a controller area network (CAN) bus connector. The CAN bus connector may be configured for connecting a plurality of CAN buses to a data concentrator. Each CAN bus may include a shielded twisted pair of wires including a CAN high wire, a CAN low wire and a CAN shield wire. The device may also include measurement circuitry configured to perform a verification test on at least the CAN high wire and CAN low wire of each CAN bus. The verification test of each CAN bus may include connecting a wire under test in a predetermined configuration relative to the other wire for performing the verification test and measuring a value of an electrical parameter associated with the wire under test. The verification test may also include comparing the value of the measured electrical parameter associated with the wire under test to an expected value of the electrical parameter. The wire under test passes the verification test in response to the measured value of the electrical parameter corresponding substantially to the expected value of the electrical parameter.

In some embodiments of the present invention in combination with any of the above embodiments, the device may include a hand-holdable portable housing with the measurement circuitry contained in the housing. A user interface for controlling operation of the device may be provided on a lace of the housing. Information related to the verification tests may be presented on a display of the user interface. The information may include test results and an identification of the bus on which the verification test is being performed based on reading a pin configuration setting of the bus by the device.

In some embodiments of the present invention in conciliation with any of the above embodiments, a device for verifying wire integrity of a bus may include an interface for connecting to the bus that is configured to select subsets of a plurality of wires in a connector of the bus for testing. The device or interface may automatically select a subset of wires of the bus and run the verification tests. The device or interface may then select another subset of wires without requiring user interaction. In this manner, all wires of the bus may be automatically verification tested.

In some other embodiments of the present invention and in combination with any of the above embodiments, the verification test may include detecting a short circuit between the wire under test and another wire of the bus and detecting a short circuit between the wire under test and a ground potential. The verification test may also include indicating that the wire passed the verification test in response to not detecting the short circuit between the wire under test and the other wire of the bus and not detecting the short circuit between wire under test and the ground potential.

In accordance with a further embodiment, a method for verifying wire integrity of a bus may include detecting connection to a bus connector. The bus connector may be configured to connect a plurality of buses to an apparatus and each bus may include a plurality of wires. The method may also include automatically performing a verification test of each bus. The verification test of each bus may include connecting a wire under test in a predetermined configuration relative to the other wire by measurement circuitry for performing the verification test and measuring a value of an electrical parameter associated with the wire under test. The method may also include comparing the value of the measured electrical parameter associated with the wire under test to an expected value of the electrical parameter. The wire under test passes the verification test in response to the measured value of the electrical parameter corresponding substantially to the expected value of the electrical parameter.

BRIEF DESCRIPTION OF THE SEVERAL VIEWS OF DRAWINGS

The following detailed description, of embodiments refers to the accompanying drawings, which illustrate specific embodiments of the disclosure. Other embodiments having different structures and operations do not depart from the scope of the present disclosure.

DETAILED DESCRIPTION

The following detailed description of embodiments refers to the accompanying drawings, which illustrate specific embodiments of the disclosure. Other embodiments having different structures and operations do not depart from the scope of the present disclosure. Like reference numerals may refer to the same element or component in the different drawings.

The exemplary wire integrity verification device embodiments are described herein as being configured for automatically detecting vehicle location and verifying the wiring integrity of a Controller Area Network (CAN) bus. However, those skilled in the art will recognize that the embodiments described herein may be easily applied to any type of bus or wiring arrangement. Controller Area Network (CAN) technology is a linear multi-drop bi-directional data bus conforming to international standard ISO-11898. Originally intended to support automotive applications, CAN may also be utilized in aerospace applications because of its cost effective and efficient networking capability for Line Replaceable Units (LRU's) that may share data across a common media. Typical CAN bus wiring is a 120 ohm shielded-twisted pair, identified as CAN-H CAN-L with a CAN-SHLD. A CAN bus may be designed to allow active feedback on the health of LRU's on the network as well as the health of the associated wiring. In one airplane application, CAN health reporting may be used for Engine Indicating and Crew-Alerting System (EICAS) maintenance messaging screen displays.

CAN is very robust and therefore good for aircraft installations; however, this robustness may lead to abnormal behaviors on the aircraft when there are physical layer defects that are not detected during assembly but escape into service. For example, experience has shown that defects such as a short circuit between CAN-L and CAN-SHLD wiring may result in intermittent communications after factory rollout. The wire integrity verification device described herein quickly and efficiently measures and records the electrical parameters of a bus under test and will catch defects early in production and alleviate the potential for defects to go unnoticed until after rollout or delivery.

Figure 1:
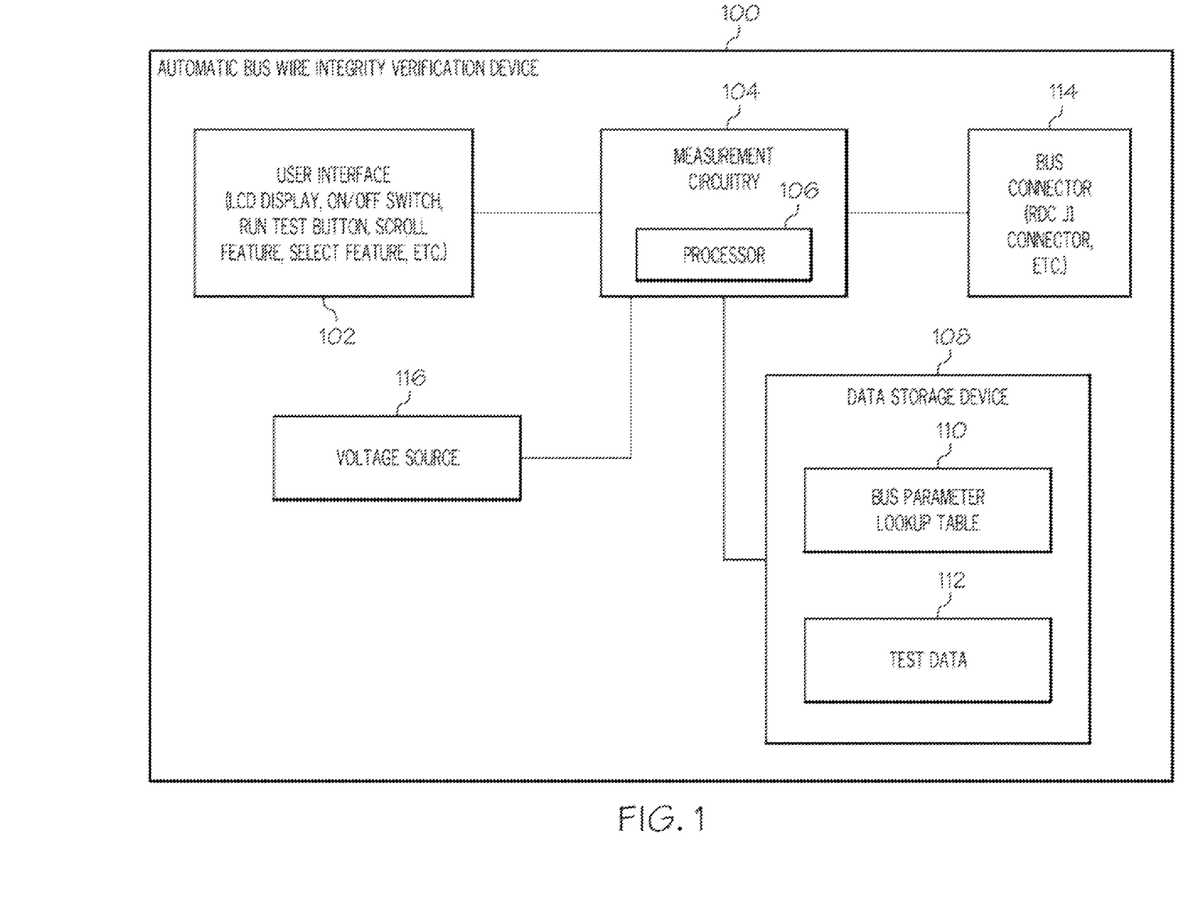
FIG. 1 is a block schematic diagram of an example of a device for verifying wire integrity of a bus in accordance with an embodiment of the present disclosure.

FIG. 1 is a block schematic diagram of an example of a device 100 for verifying wire integrity of a bus in accordance with an embodiment of the present disclosure. The device 100 may be an automatic hand-held bus wire integrity verification device configured to automatically test multiple different buses that may be connected to a remote data concentrator (RDC) or other apparatus onboard a vehicle, such as an airplane or other vehicle, similar to that described herein. A plurality of separate wires for transmitting data may be associated with each bus. The device 100 defines an interface for connecting to the bus that is configured to select subsets of the plurality of wires in a bus connector for testing as described in more detail below. The device 100 may automatically perform verification wire tests on all data wires of the bus. The device 100 may automatically select a subset of wires for verification testing and run the desired tests and then switch or select a next subset of wires for verification testing.

The device 100 may include a user interface 102 for controlling operation of the device. The user interface 102 may include but is not necessarily limited to a display for presenting test results and other information related to the wire integrity verification testing to a user or operator; an on/off switch or other mechanism for turning the device on and off; a "run test" feature or button that may be operated by the user to run a particular verification test selected by the user; a scroll feature to scroll through test results or other information on the display or scroll through options that are selectable by the user, a "select" feature or button to select a highlighted option or other item presented on the display; and the user interface 102 may include any other features that may permit a user to perform the functions described herein or evaluate the test results. An example of an automatic hand-held bus wire integrity verification device including a user interface will be described in more detail with reference to FIG. 3.

The device 100 may also include measurement circuitry 104 that may be configured to perform wire integrity verification tests similar to those described herein. The measurement circuitry 104 may include: a processor 106 or controller for controlling operation of the device 100 and automatically performing the wire integrity verification tests similar to that described herein. Examples of measurement circuitry that may be used for the measurement circuitry 104 will be described in more detail with reference to FIGS. 6, 7 and 8.

The device 100 may also include a data storage device 108. The data storage device 108 may include a bus parameter lookup table 110. The processor 106 may look up a bus parameter, such as an expected voltage, for a particular bus and wire for comparison to a bus parameter measured by the measurement circuitry 104 during a wire integrity verification test to determine whether the particular wire or bus under test passes or fails the verification test similar to that described in more detail herein. The data storage device 108 may also store test data 112. The test data 112 may be transferred to another computer device for analysis or evaluation.

The device 100 may also include a connector 114 configured to connect to a mating connector or plug for performing wire integrity verification tests on a bus or other wiring arrangement as described in more detail below. As describe with reference to FIG. 3, a test cable may be attached to the connector 114 and the test cable may be configured for connecting to a stub of a bus. The connector 114 may be a bus connector for connecting to a mating connector of a bus. For example, the bus connector may be configured to matingly receive an RDC J1 stub that has been disconnected from an RDC similar to that described with reference to FIG. 3. The processor 106 or measurement circuitry 104 may be configured for automatically testing all wires of a bus under test that includes a plurality of data wires. The processor 106 or measurement circuitry 104 may automatically select a subset of bus wires needed for verification testing and run the desired test then switch or select the next subset of wires for testing without requiring user interaction thus reducing time and labor.

The device 100 may additionally include a voltage source 116 or battery for powering the device 100. The voltage source 136 or battery may be a rechargeable battery. The device 100 may be powered off after a preset time period of inactivity to preserve the charge on the battery.

Figure 2:
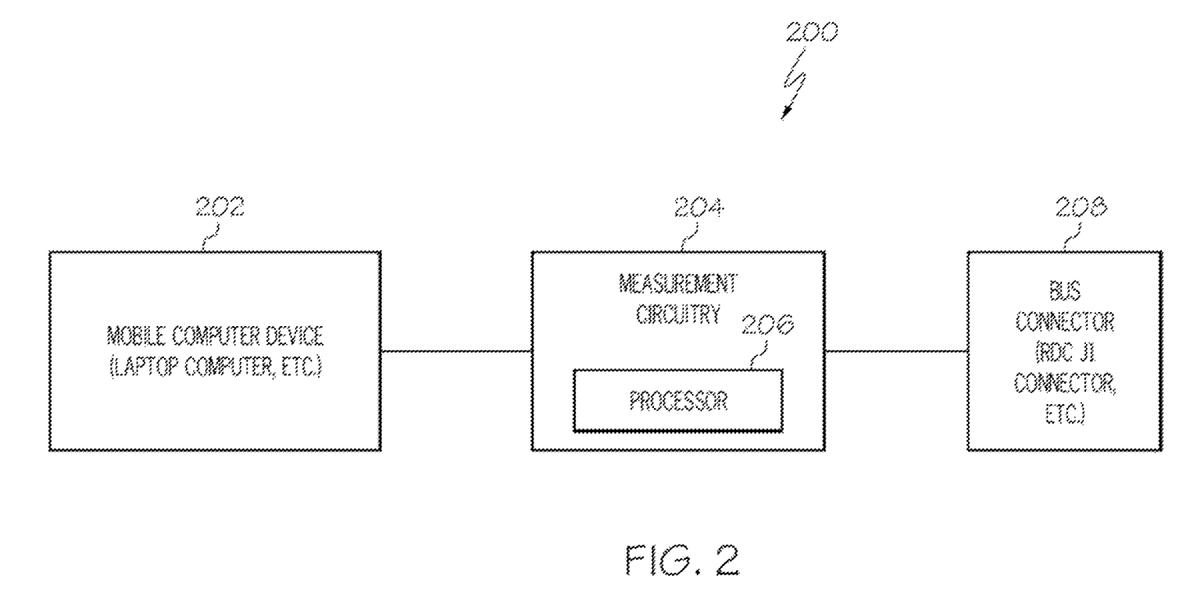
FIG. 2 is a block schematic diagram of another device for verifying wire integrity of a bus in accordance with another embodiment of the present disclosure.

FIG. 2 is a block schematic diagram of an example of another device 200 for verifying wire integrity of a bus or other wiring arrangement in accordance with another embodiment of the present disclosure. The device 200 may include a mobile computer device 202 and measurement circuitry 204. The measurement circuitry 204 may be similar to the measurement circuitry 104 in FIG. 1 and may be configured to perform the functions and verification tests described herein. The measurement circuitry 204 may include a processor 206 for controlling operation of the measurement circuitry 204. The mobile computer device 202 may be a standard laptop computer or other mobile computing device that is a separate component from the measurement circuitry 204. The mobile computer device 202 may be programmed to operate in coordination with the measurement circuitry 204. The mobile computer device 202 may receive test data from, the measurement circuitry 204 for storage and analysis. Test results may be presented on a display of the mobile computer device 202 or laptop computer and the user or operator may select options related to the verification test using a computer pointing device of the mobile computer device 202.

The device 200 may also include a connector 208 or bus connector. The connector 208 may be similar to the connector 114 and may be configured to connect to a mating connector of a bus or other cable wiring arrangement.

Figure 3:
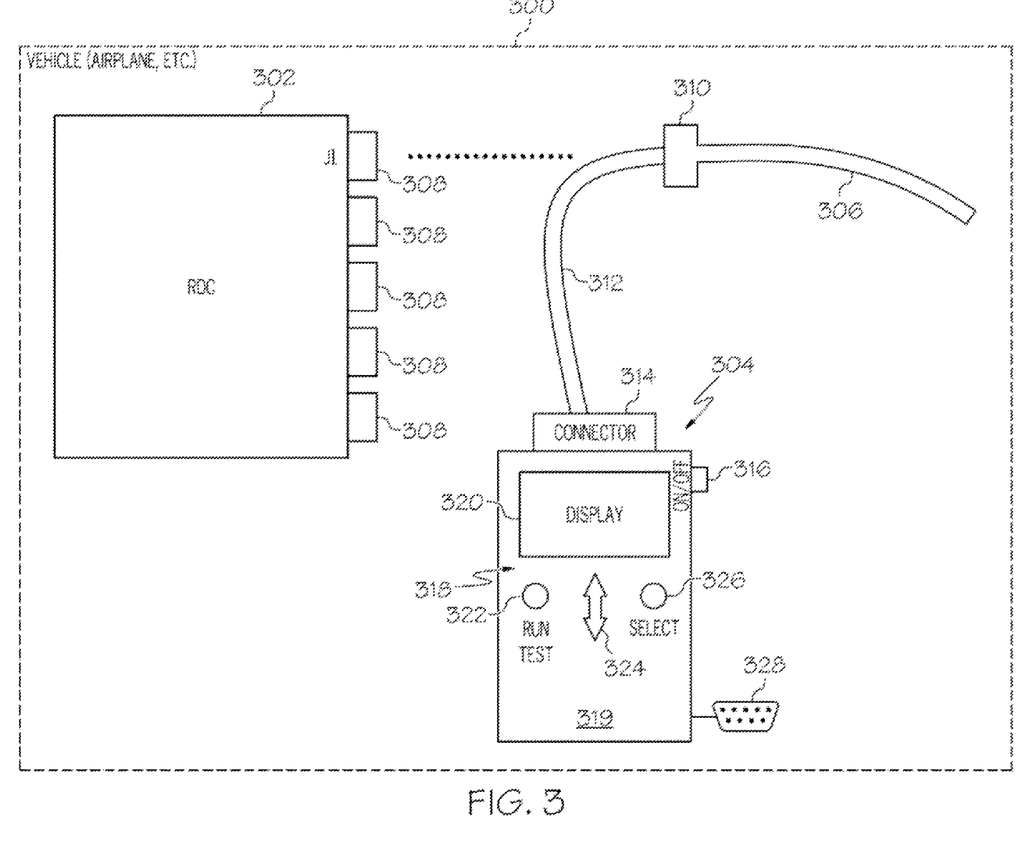
FIG. 3 is an illustration of a vehicle including a remote data concentrator (RDC) onboard the vehicle and a front view of an exemplary hand-held bus wire integrity verification device in accordance with an embodiment of the present disclosure.

FIG. 3 is an illustration of a vehicle 300 including a remote data concentrator (RDC) 302 onboard the vehicle 300 and a front view of an exemplary hand-held bus wire integrity verification device 304 in accordance with an embodiment of the present disclosure. The automatic bus wire integrity verification device 100 in FIG. 1 may be embodied in the hand-held wire integrity verification device 304. A bus 306 may be connected to a receptacle or jack 308 of the RDC 302 by a mating plug 310 on an end or stub of the bus 306. The RDC 302 may include multiple receptacles 308 for connecting multiple buses similar to bus 306. The bus 306 may be disconnected from the RDC 302 and may be connected to the hand-held bus wire integrity verification device 304 as shown in FIG. 3 for performing wire integrity verification tests as described herein. The bus 306 may be a controller-area network (CAN) bus or other type bus or wiring arrangement. A test cable 312 may be attached at one end to a connector 314 mounted on a top side of the device 304. An opposite end of the test cable 312 may include a connector to matingly connect to the plug 310 of the bus 306. The test cable passes through the CAN buses and configuration pins to the device 304 via the connector 314.

As illustrated in FIG. 3, the exemplary hand-held bus wire integrity verification device 304 may include an On/Off switch feature 316. The On/Off switch feature 316 may be any type of arrangement for turning the device 304 on and off. The On/Off switch feature 316 may be mounted in a side of the device 304 similar to that illustrated in FIG. 3. The device 304 may also include a user interlace 318 provided on a front face 319 of the device 304. The user interface 318 may include a display 320 for providing information to a user or operator related to the wire integrity verification tests. The display 320 may be a liquid crystal display or other durable display. The display 320 may be backlit for visibility in dark or low light areas such as some spaces onboard an airplane. The display 320 may also include a feature for highlighting or distinguishing, elements presented on the display 320. The user interface 318 may also include a "Run Test" feature 322 or button which may be operated by the user to automatically run wire integrity verification tests on the bus 306 connected to the device 304. An opposite side or face (not shown in FIG. 3) of the device 304 from the front face 319 may include directions for use of the device 304.

The user interface 318 may additionally include a scroll feature 324 and a "Select" feature or button 326. The scroll feature 324 permits a user to scroll through information, options or other data presented on the display 320. The scroll feature 324 may include up/down arrows or similar scrolling mechanism. The display 320 may also be a touch sensitive display that permits scrolling using a human finger. The "Select" feature 326 allows the user to select a particular item that may be highlighted in the display 320 by scrolling.

Figure 4:
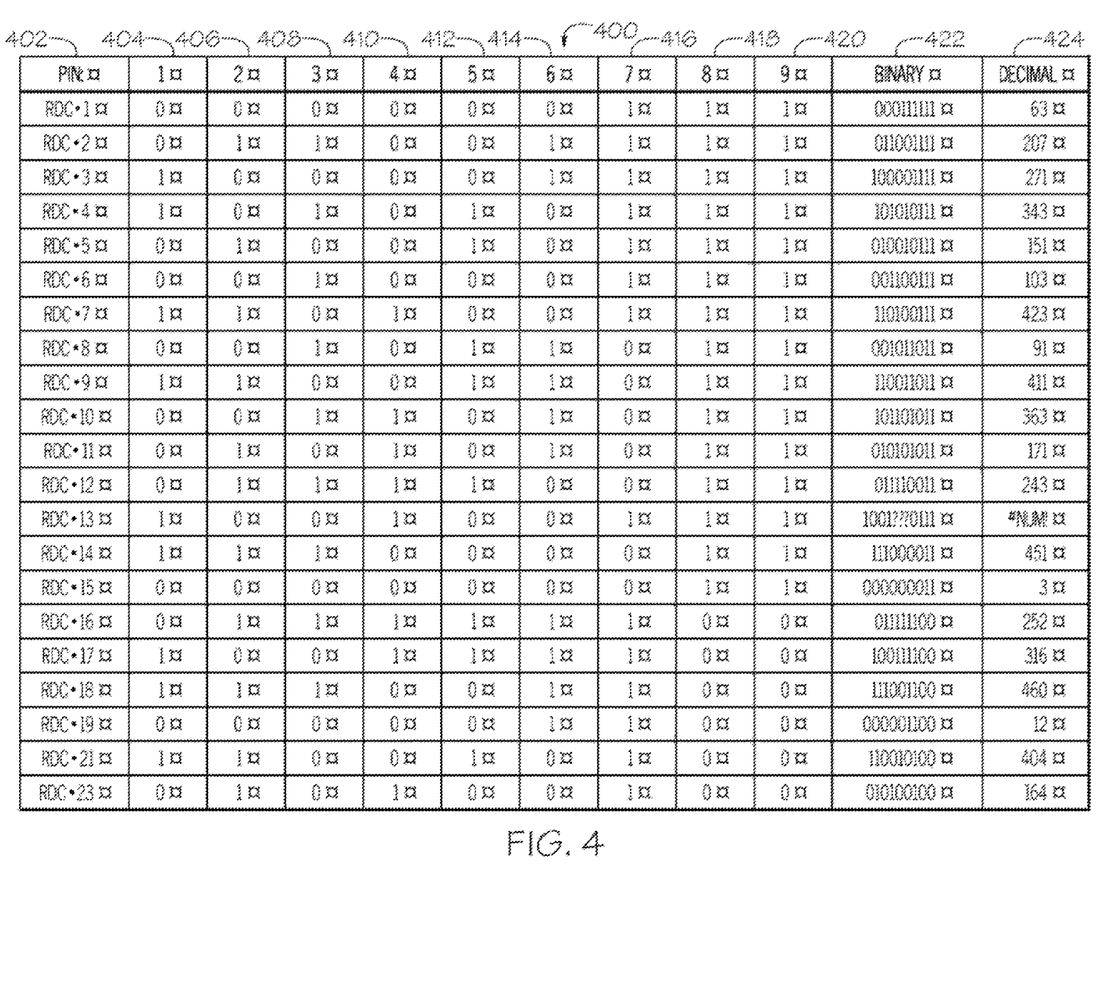
FIG. 4 is an example of a table of remote data concentrator (RDC) configuration pin settings usable by the device to self-identify location on a vehicle in accordance with an embodiment of the present disclosure.

The device 304 or processor, similar to processor 106 in FIG. 1, of the device 304 may be configured to read pin configuration settings of the bus 306. The pin configuration settings corresponds to the proper or valid RDC 302 to which the bus 306 is to be connected and identities the RDC 302. Accordingly, the device 304 or processor of the device 304 verifies that the bus 306 is connected to the proper or valid RDC 302 based on the pin configuration settings. FIG. 4 is an example of a table 400 of RDC configuration pin settings for multiple RDCs including columns 402-424 in accordance with an embodiment of the present disclosure. A first column 402 identifies in each row a particular RDC and each of a plurality of columns 404-420 may indicates a value in each row, either a 0 or a 1, on each pin of the plug 310 that collectively identify the particular RDC to which the plug 310 is to be connected. A column 422 may also identify a binary identification number and another column 424 may identify a corresponding decimal number associated with the particular RDC in each row of the table 400. A location on the vehicle 300 of each RDC may be based on the configuration pin setting of each RDC. Accordingly, the RDC configuration pin settings are used by the device 304 to self-identity a location on the vehicle 300 and verify that a valid RDC 302 for that particular location is being tested.

The device 304 defines an interface for connecting to the connector or mating plug 310 of the bus 306 and is configurable to select subsets of the plurality of wires in the bus connector or plug 310 for testing or verifying the integrity as described in more detail below.

Figure 5A:
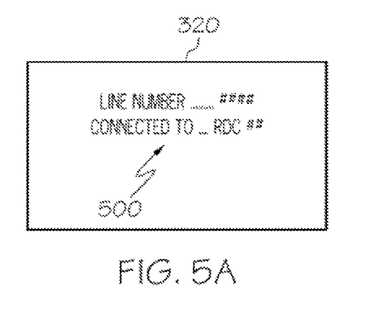
FIGS. 5A-5F illustrate examples of different information that may be presented on a display of an exemplary bus wire integrity verification device in response to the wire integrity verification testing in accordance with an embodiment of the present disclosure.
Figure 5B:
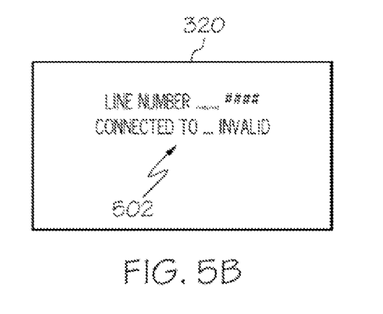

Referring also to FIGS. 5A-5F, FIGS. 5A-5F illustrate examples of different information that may be presented on the display 320 of the exemplary bus wire integrity verification device 304 in response to the wire integrity verification testing in accordance with an embodiment of the present disclosure. FIG. 5A illustrated the display 320 providing information 500 corresponding to the line number or bus under test and the corresponding RDC identification number that the bus is properly connected to. FIG. 5B is an example of Information 502 on the display 320 of the line number or bus being improperly connected to a wrong or invalid RDC.

Figure 5C:
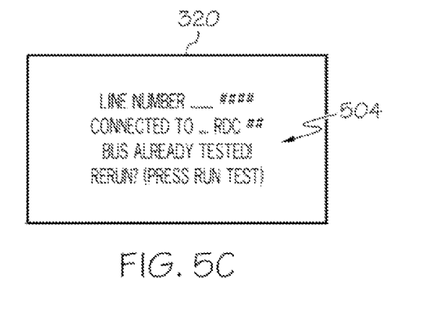

FIG. 5C is an example of the device 304 detecting that the particular line number or bus has already been tested and provides a notice 504 on the display 320 that the bus has already been tested and prompts the user if the user wants to rerun the wire integrity verification test on the bus. The test may be rerun by operating or pressing the "Run Test" button 322 in FIG. 3.

Figure 5D:
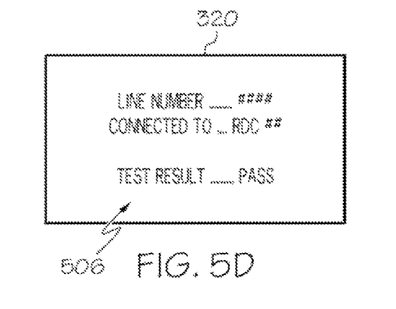
Figure 5E:
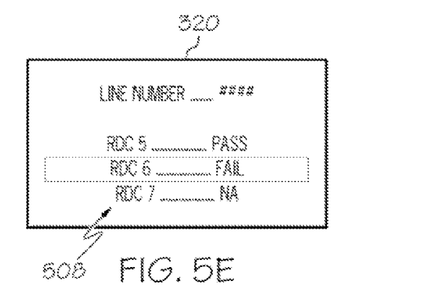
Figure 5F:
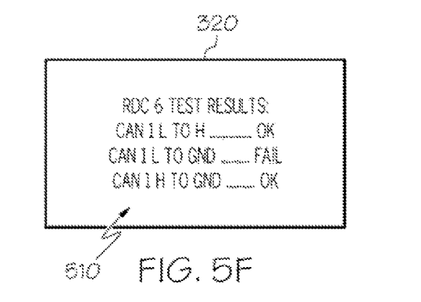

FIG. 5D is an example of a display 320 providing test results 506 that the bus passed the wire integrity verification test. FIG. 5E provides an example of the display 320 providing test results 508 including a list of RDCs and the wire integrity verification test results associated with each RDC. A user may scroll through the list of RDCs using the scroll feature 324 on the user interface 318 of the device 304 and may select a particular RDC in the list in response to operating the "Select" feature 326 on the user interface 318. As illustrated in the example of FIG. 5E, RDC 6 which failed the verification test was selected. FIG. 5F provides test results 510 for each of the wires of the bus connected to RDC 6 in response to the "Select" feature 326 or button being operated to select RDC 6 in the list 508.

The hand-held bus wire integrity device 304 may also include a connector 328, such as: a DB9 or Universal Serial Bus (USB) connector, that permits the device 304 to be connected to a laptop computer or other computer device for transferring test results, updating or modifying any software running on the device 304 and changing the battery or voltage source, such as voltage source 116 in FIG. 1.

Figure 6:
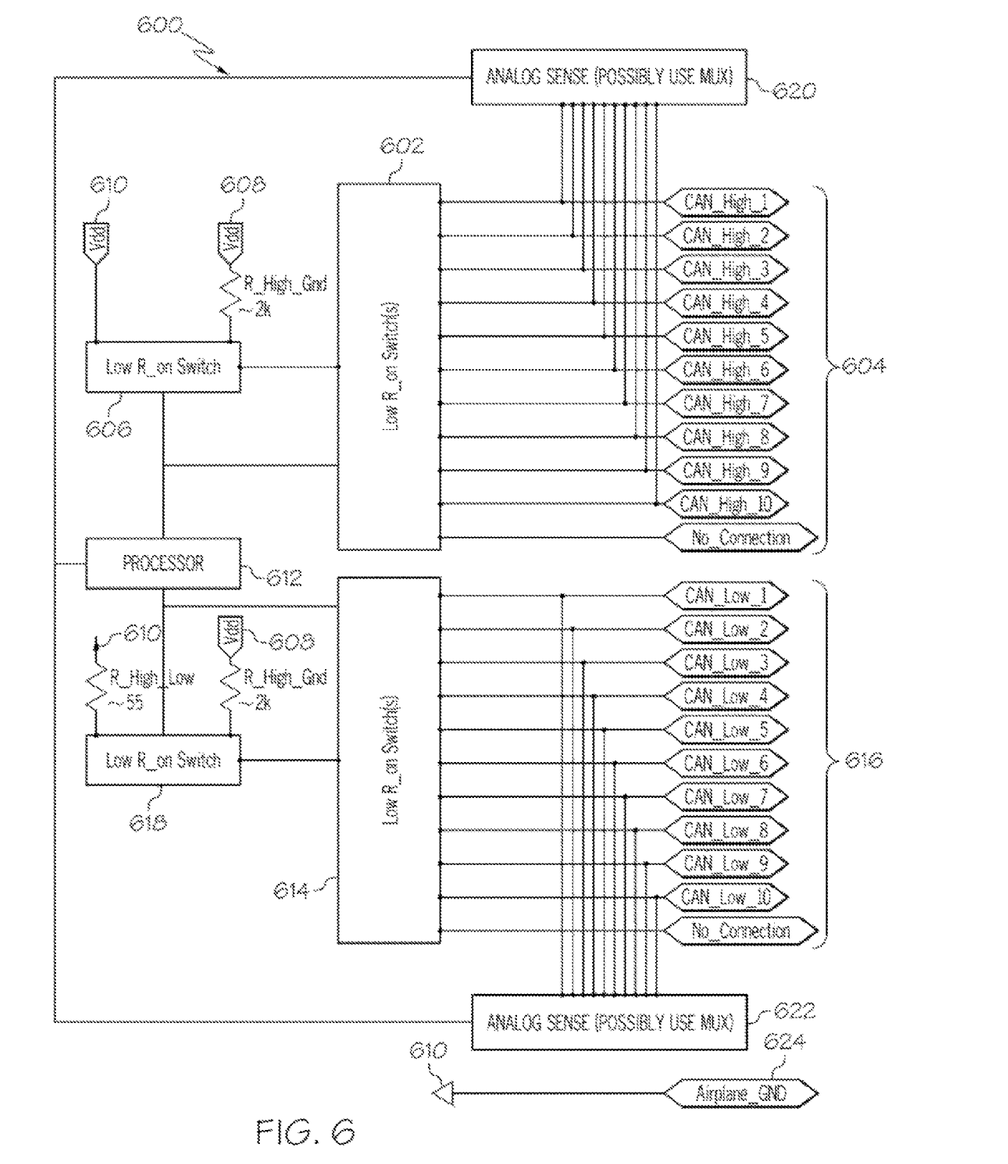
FIG. 6 is a schematic diagram of an example of measurement circuitry for a bus wire integrity verification device in accordance with an embodiment of the present disclosure.

FIG. 6 is a schematic diagram of an example of measurement circuitry 600 for a bus wire integrity verification device in accordance with an embodiment of the present disclosure. The measurement circuitry 600 may be used for the measurement circuitry 104 in FIG. 1 or measurement circuitry 204 in FIG. 2. The example measurement circuitry 600 in FIG. 6 is shown as being connected for wire integrity verification testing of a CAN bus. However, those skilled in the art will recognize that the measurement circuitry may be adapted for use on any type bus or wiring arrangement. The measurement circuitry 600 may include a first switch module 602 including a set of input terminals for respectively connecting to each of a plurality of CAN high wires 604 of a CAN bus. The first switch module 602 may also include a single output terminal connected to an input of a second switch module 606. The second switch module 606 may include two output terminals. One terminal may be connected to a voltage source 608 through a resistor and the other terminal may be connected directly to the voltage source 608 as an input for testing a CAN high to CAN low short circuit as described in more detail herein. The resistor may be included between the voltage source 608 and the switch module 606 to prevent measured short circuits from damaging components within the device. The voltage source 608 may be the voltage source for the device, such as voltage source 116 in FIG. 1. The first switch module 602 and the second switch module 606 may each include a low resistance on switch or switches. A processor 612 may control the operation of the first switch module 602 and the second switch module 606 for performing the wire integrity verification tests as described in more detail with reference to FIGS. 10 and 11A-11C. For example, the processor 612 may control the first switch module 602 and second switch module 606 to respectively connect one of the CAN high wires 604 to either the voltage source 608 or ground potential 610 for performing the verification tests.

The measurement circuitry 600 may also include a third switch module 614 including a set of input terminals for respectively connecting to each of a plurality of CAN low wires 616 of the CAN bus. The third switch module 614 may also include a single output terminal connected to an input terminal of a fourth switch module 618. The fourth switch module 618 may include two output terminal respectively connected to the voltage source 608 and ground or ground potential 610. Resistors may be included between the voltage source 608 and ground 610 and the switch module 618 to prevent measured short circuits from damaging components within the device. The third switch module 614 and the fourth switch module 618 may each include a low resistance on switch or switches. The processor 612 may also control the operation of the third switch module 614 and the fourth switch module 618 for performing the wire integrity verification tests as described in more detail with reference to FIGS. 10 and 11A-11C. For example, the processor 612 may control the third switch module 614 and fourth switch module 618 to respectively connect one of the CAN low wires 616 to either the voltage source 608 or ground potential 610 for performing the verification tests.

The measurement circuitry 600 may also include a first analog sense module 620 that may be connected to each CAN high wire 604 and a second analog sense module 622 that may be connected to each CAN low wire 616 of the CAN bus to measure a value of an electrical parameter of whichever CAN high wire 604 or CAN low wire 616 may be under test based on a predetermined configuration of the wires for performing the verification tests similar to that described with reference to FIGS. 10 and 11A-11C. A multiplexer may be associated with each analog sense module 620 and 622 for measuring the electrical parameter associated with the wire under test.

As previously discussed, the wire integrity verification device including the measurement circuitry 600 may be used to verily the wire integrity of a bus onboard a vehicle, such as an airplane. Accordingly, for some verification tests, a ground 624 of the vehicle or airplane as illustrated in FIG. 6 may be connected to a ground 610 of the measurement circuitry 600 of the device 100 FIG. 1 or 200 FIG. 2.

Figure 7:
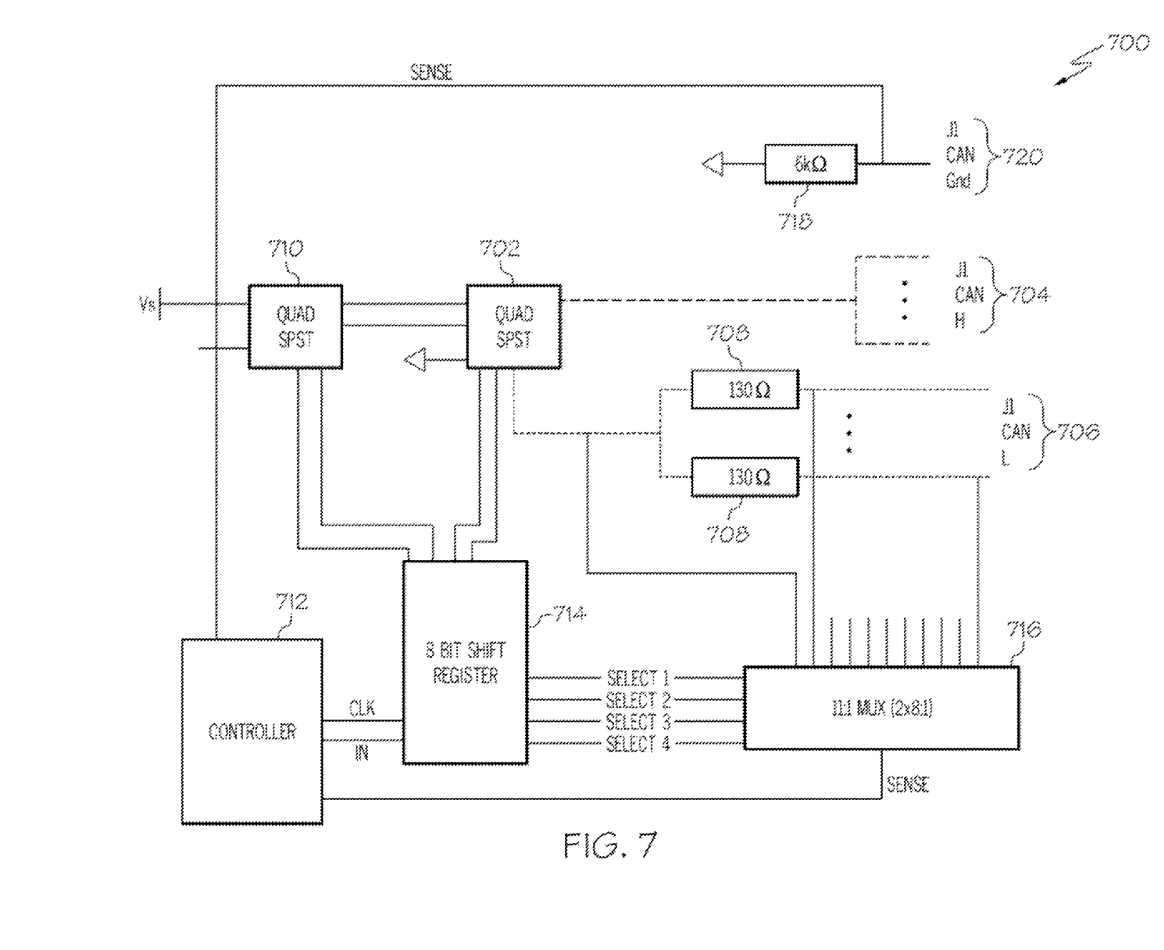
FIG. 7 is a schematic diagram of an example of measurement circuitry for a bus wire integrity verification device in accordance with another embodiment of the present disclosure.

FIG. 7 is a schematic diagram of an example of measurement circuitry 700 for a bus wire integrity verification device in accordance with another embodiment of the present disclosure. The measurement circuitry 700 may be used for the measurement circuitry 104 in FIG. 1 or 204 in FIG. 2. The measurement circuitry 700 may include a first quad single pole single throw (SPST) switch 702 including inputs for respectively connecting to a plurality of CAN high wires 704 and a plurality of CAN low wires 706. Each CAN low wires 706 may be respectively connected to the first quad SPST switch 702 by a resistor 708, for example, a 130 ohm resistor as illustrated in the exemplary measurement circuitry 700 in FIG. 7.

A first and second output of the first quad SPST switch 702 may be connected to a second quad SPST switch 710 and a third output of the first SPST switch 702 may be connected to ground. A first output of the second quad SPST switch 710 may be connected to a voltage source, such as the voltage 116 for the device 100 in FIG. 1. A second output of the second SPST switch 710 may be open or not connected to anything.

A controller 712 may be connected to an 8 bit shift register 714 for controlling operation of the first and second quad SPST switches 702 and 710. The 8 bit shift register 714 is connected respectively to the first quad SPST switch 702 and the second quad SPST switch 710. The controller 712 may control operation of the quad SPST switches 702 and 710 by signals to the shift register 714 on clock (clk) and input connections or leads. The quad SPST switches 702 and 710 may be controlled by the processor 712 and the shift register 714 to respectively connect the CAN high wires 704 and CAN low wires 706 of the CAN bus under test to perform the wire integrity verification tests similar to that described with reference to FIGS. 10 and 11A-11C.

The measurement circuitry 700 may also include a multiplexer (MUX) 716 and sense resistor 718. The MUX 716 may be controlled by the controller 712 to connect the sense resistor 718 in association with a particular wire 704, 706 under test for measuring a voltage (value of an, electrical parameter) across the sense resistor for determining whether the wire under test passes or fails the particular integrity verification test similar to that described with reference to FIGS. 9 and 10A-10C. A CAN ground wire 720 may be connected to the sense resistor 718 which is connected to ground and to the controller 712.

Figure 8:
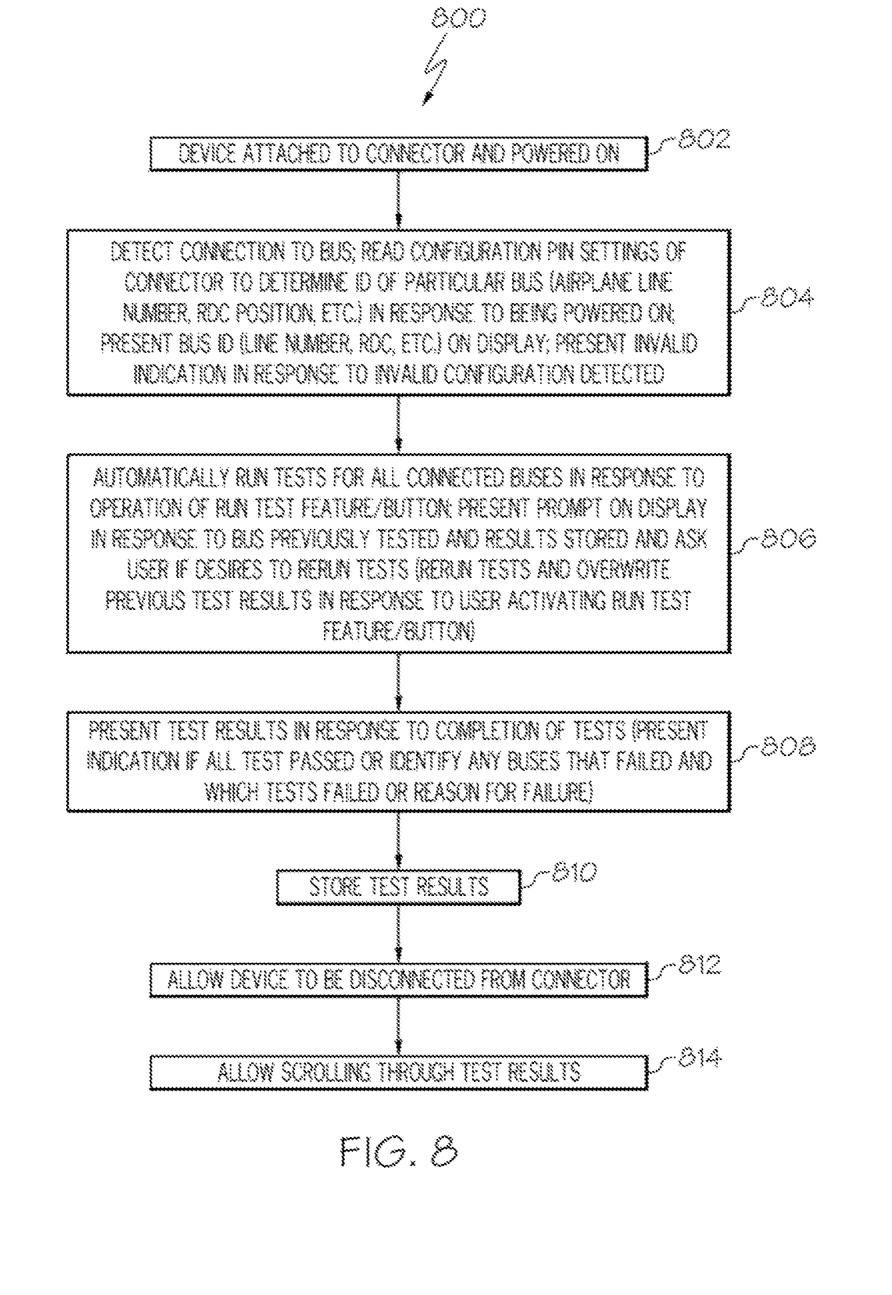
FIG. 8 is a flow chart of an exemplary method for verifying wire integrity of a bus in accordance with an embodiment of the present disclosure.

FIG. 8 is a flow chart of an exemplary method 800 for verifying wire integrity of a bus in accordance with an embodiment of the present disclosure. The method 800 may be embodied in the automatic bus wire integrity verification device 100 in FIG. 1, the device 200 for verifying wire integrity of a bus in FIG. 2 or the verification device 304 in FIG. 3. In block 802, a device for automatic wire integrity verification testing of a bus or other wire arrangement may be connected to a connector of a bus and the device may be powered on.

In block 804, a connection to the bus may be detected. Configuration pin settings of the connector may be read to determine an identification of a particular bus or a particular RDC from which the bus was removed. For example, if the bus was connected to an RDC onboard an airplane, an airplane line number, an RDC identification which may correspond to a position of the RDC and/or other information may be determined from reading the configuration pin settings.

In block 806, the verification tests may be automatically run for all connected buses in response to operation of a "Run Test" feature or button similar to that previously described. All wires of the bus may be tested. A subset of bus wires may be selected for verification testing and the desired tests run as described herein run. The method 800 or device embodying the method 800 may then automatically switch to a next subset of bus wires for verification testing without requiring user interaction. A prompt may be presented on a display of the bus wire integrity verification device in response to the bus having been previously tested and results stored in the device. A message may be presented on the display requesting if the user or operator desires to rerun the tests and overwrite the previous test results. The wire integrity verification tests may be rerun on the connected bus in response to the user activating a "Run Test" feature or button similar to that previously described. Examples of wire integrity verification tests that may be run in block 806 will be described with reference to FIG. 9.

In block 808, the test results may be presented in response to completion of the wire integrity verification tests. An indication may be presented if all buses passed the verification tests. Any buses that failed may be identified and reasons for failure may also be presented.

In block 810, the test results may be stored. In block 812, the device may be disconnected from the bus connector.

In block 814, scrolling through the test results may be allowed similar to that previously described with reference to FIGS. 5E and 5F.

Figure 9:
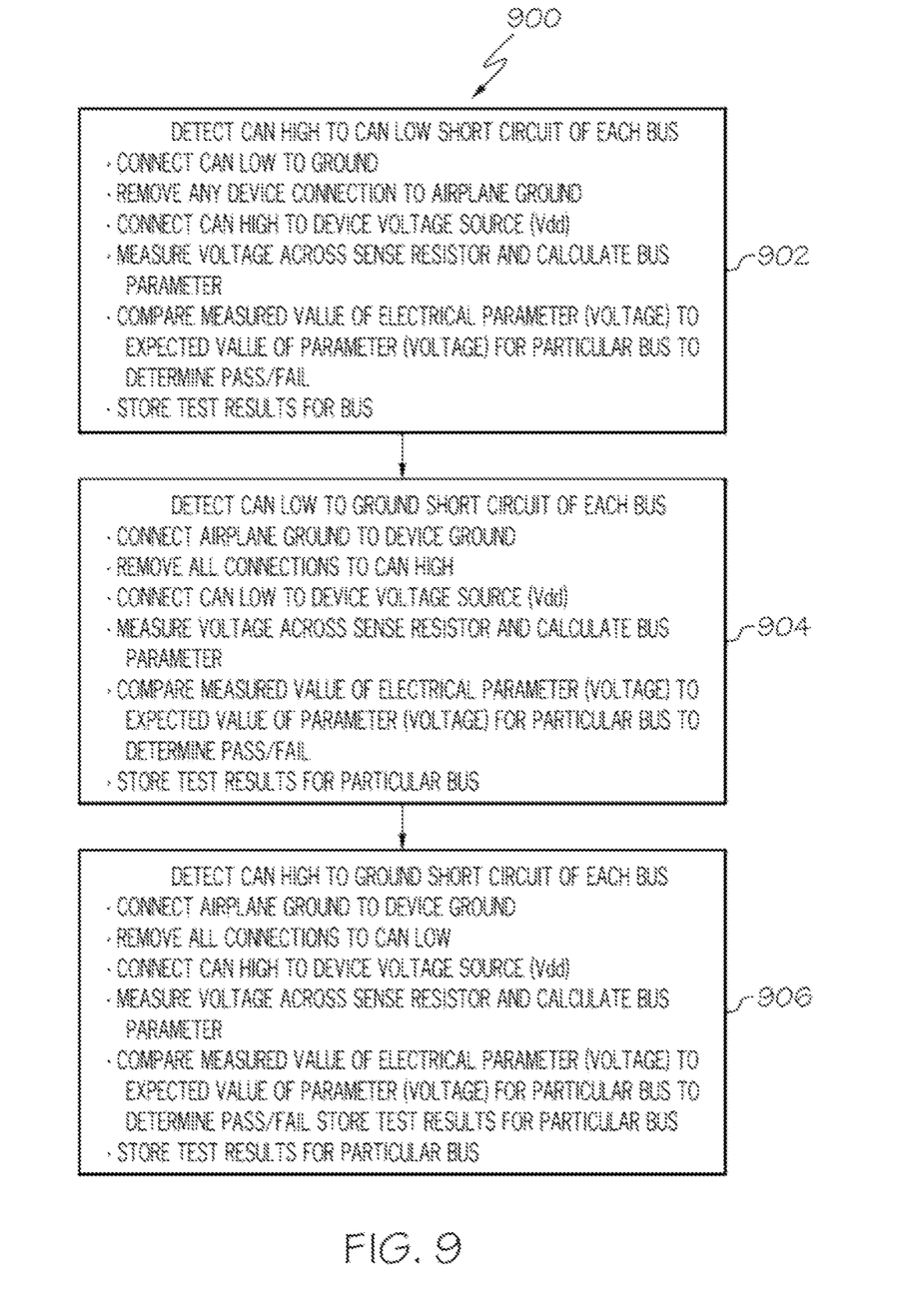
FIG. 9 is a flow chart of an exemplary method including tests for verifying wire integrity of a bus in accordance with an embodiment of the present disclosure.
Figure 10A:
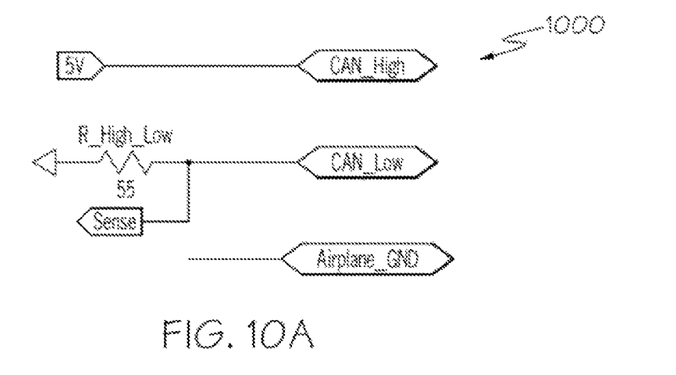
FIGS. 10A-10C are each a schematic diagram illustrating an exemplary configuration of the measurement circuitry for each of the integrity verification tests in FIG. 9 in accordance with an embodiment of the present disclosure.

FIG. 9 is a flow chart of an exemplary method 900 including tests for verifying wire integrity of a bus in accordance with an embodiment of the present disclosure. The method 900 may be used for the verification tests in block 806 of FIG. 8. In block 902, a verification test to detect a short circuit between a particular CAN high wire and an associate CAN low wire may be performed. Assuming the CAN bus is onboard an airplane, the verification test to detect the short circuit between the particular CAN high wire under test and the associated CAN low wire may include connecting the associated CAN low wire to ground potential and removing any connection of the verification device to a ground of the airplane. The wire integrity verification test may also include connecting the particular CAN high wire to a voltage source of the device and measuring a voltage across a sense resistor associated with the particular CAN high wire. The measured voltage may be compared to an expected voltage for the particular CAN high wire. The expected voltage for the particular bus may be stored in a bus parameter lookup table similar to lookup table 110 in FIG. 1. A short circuit is not detected in response to the measured voltage corresponding substantially to the expected voltage and the verification test is passed. The expected voltage is a function of the termination resistors on the bus and the number and resistive characteristics of the communicating LRUs attached to the bus. A short circuit is detected in response to the measured voltage not corresponding substantially to the expected voltage and the verification test is failed. Referring also to FIG. 10A, FIG. 10A is a schematic diagram illustrating an exemplary configuration 1000 formed by the measurement circuitry (600, 700 or 800) which also corresponds to the connections described above with reference to block 902 of FIG. 9.

Figure 10B:
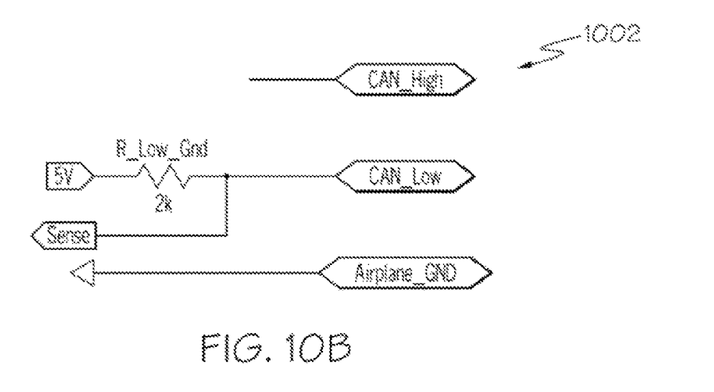

In block 904, a verification test to detect a short circuit between the associated CAN low wire and ground may be performed. The verification test to detect the short circuit between the associated CAN low wire and ground may include connecting a ground of the wire integrity verification device to a ground of the airplane and removing all connections to the particular CAN high wire. The verification test may also include connecting the associated CAN low wire to a voltage source of the device and measuring a voltage across a sense resistor associated with the associated CAN low wire. The measured voltage may be compared to an expected voltage for the associated CAN low wire from a bus parameter lookup table similar to table 110 in FIG. 1. A short circuit is not detected in response to the measured voltage corresponding substantially to the expected voltage and the verification test is passed. A short circuit is detected in response to the measured voltage not corresponding substantially to the expected voltage and the verification test is failed. Referring also to FIG. 10B, FIG. 10B is a schematic diagram illustrating an exemplary configuration 1002 formed by the measurement circuitry (600, 700 or 800)

which also corresponds to the connections described above with reference to block 904 of FIG. 9.

Figure 10C:
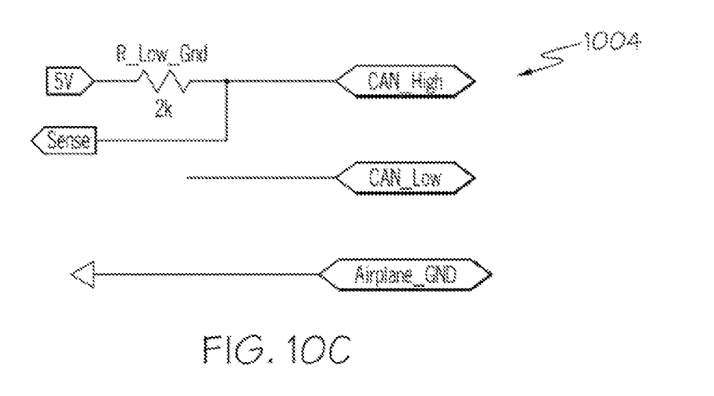

In block 906, a verification test to detect a short circuit between the particular CAN high wire and ground may be performed. The verification test to detect the short circuit between the particular CAN high wire and ground may include connecting a ground of the device to a ground of the airplane and removing all connections to the particular CAN low wire. The verification test may also include connecting the particular CAN high wire to a voltage source of the wire integrity verification device and measuring a voltage across a sense resistor associated with the particular CAN high wire. The measured voltage may be compared to an expected voltage for the particular CAN high wire from the bus parameter lookup table, such as table 110 in FIG. 1. A short circuit is not detected in response to the measured voltage corresponding substantially to the expected voltage and the verification test is passed. A short circuit is detected in response to the measured voltage not corresponding substantially to the expected voltage and the verification test is failed. Referring also to FIG. 10C, FIG. 10C is a schematic diagram illustrating an exemplary configuration 1104 formed by the measurement circuitry (600, 700 or 800) which also corresponds to the connections described above with reference to block 906 of FIG. 9.

As evident from the preceding description, the embodiments of the wire integrity verification device described is simple to use in the factory and on the flight line and provides an effective tool to ensure build quality of airplane CAN buses or other wiring arrangement. The device may be utilized by mechanics of varying experience. The capabilities of the device automate the verification testing to provide a simple user-interface that mitigates the potential for user error. The handheld device may be carried and used throughout the airplane for wire verification testing. Implementation of data sync technologies will streamline the design by reducing operation hours and maintaining quality standards.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of embodiments of the invention. As used herein, the singular forms "a", "an" and "the" are intended to include the plural forms as well unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to embodiments of the invention in the form disclosed. Many modifications and variations will be apparent to those of ordinary skill in the art without departing from the scope and spirit of embodiments of the invention. The embodiment was chosen and described in order to best explain the principles of embodiments of the invention and the practical application, and to enable others of ordinary skill in the art to understand embodiments of the invention for various embodiments with various modifications as are suited to the particular use contemplated.

Although specific embodiments have been illustrated and described herein, those of ordinary skill in the art appreciate that any arrangement which is calculated to achieve the same purpose may be substituted for the specific embodiments shown and that embodiments of the invention have other applications in other environments. This application is intended to cover any adaptations or variations of the present invention. The following claims are in no way intended to limit the scope of embodiments of the invention to the specific embodiments described herein.

What is claimed is:

1. A device for verifying wire integrity of a bus, comprising:
a bus connector configured to connect to a bus comprising a plurality of wires, wherein the bus comprises pin configuration settings and the device is configured to read the pin configuration settings of the bus and verify that the bus is being connected to a valid or proper data concentrator of a multiplicity of data concentrators based on the pin configuration settings;
measurement circuitry configured to perform a verification test on each wire of the bus, the verification test of each wire comprising:
connecting a wire under test in a predetermined configuration relative to the other wires for performing the verification test;
measuring a value of an electrical parameter associated with the wire under test; and
comparing the value of the measured electrical parameter associated with the wire under test to an expected value of the electrical parameter, the wire under test passing the verification test in response to the measured value of the electrical parameter corresponding substantially to the expected value of the electrical parameter.

2. The device of claim 1, further comprising a handholdable portable housing, the measurement circuitry being contained within the housing.

3. The device of claim 2, further comprising a user interface for controlling operation of the device provided on a face of the housing.

4. The device of claim 3, wherein the user interface comprises a display for providing information related to the verification test.

5. The device of claim 4, wherein the information comprises test results of the verification test on each wire of the bus.

6. The device of claim 4, wherein the information comprises an identification of the bus on which the verification test is being performed based on reading the pin configuration settings of the bus by the device.

7. The device of claim 1, further comprising a connector for connecting the measurement circuitry to a mobile computer device, the mobile computer device being configured for controlling operation of the device and storing results of the verification test of each wire of the bus.

8. The device of claim 1, wherein the verification test further comprises:
    detecting a short circuit between the wire under test and another wire of the bus;
    detecting a short circuit between the wire under test and a ground potential; and
    indicating that the wire passed the verification test in response to not detecting the short circuit between the wire under test and the other wire of the bus and not detecting the short circuit between wire under test and the ground potential.

9. The device of claim 8, wherein detecting the short circuit between the wire under test and the other wire of the bus comprises:
    connecting the wire under test to ground by the measurement circuitry;
    connecting the other wire to a voltage source of the device by the measurement circuitry;
    measuring a voltage across a sense resistor associated with the wire under test by the measurement circuitry; and
    comparing the measured voltage to an expected voltage for the wire by the measurement circuitry, the short circuit being detected in response to the measured voltage not corresponding substantially to the expected voltage.

10. The device of claim 8, wherein detecting the short circuit between the wire under test and the ground potential comprises:
    connecting a ground of an airplane including the bus to a ground of the device by the measurement circuitry;
    removing any connections to other wires of the bus by the measurement circuitry;
    connecting the wire under test to a voltage source of the device by the measurement circuitry;
    measuring a voltage across a sense resistor associated with the wire under test by the measurement circuitry; and
    comparing the measured voltage to an expected voltage for the wire by the measurement circuitry, wherein the short circuit is detected in response to the measured voltage not corresponding substantially to the expected voltage.

11. A device for verifying wire integrity of a bus, comprising:
    a bus connector configured to connect to a controller area network (CAN) bus connector, the CAN bus connector being configured for connecting a plurality of CAN buses to a data concentrator, each CAN bus comprising a shielded twisted pair of wires including a CAN high wire, a CAN low wire and a CAN shield wire, wherein each of the plurality of CAN buses comprises pin configuration settings and the device is configured to read the configuration settings of each CAN bus and verify that each CAN bus is being connected to the data concentrator that is a valid or proper data concentrator of a multiplicity of data concentrators;
    measurement circuitry configured to perform a verification test on at least the CAN high wire and CAN low wire of each CAN bus, the verification test of each CAN bus comprising:
        connecting a wire under test in a predetermined configuration relative to the other wire for performing the verification test;
        measuring a value of an electrical parameter associated with the wire under test; and
        comparing the value of the measured electrical parameter associated with the wire under test to an expected value of the electrical parameter, the wire under test passing the verification test in response to the measured value of the electrical parameter corresponding substantially to the expected value of the electrical parameter.

12. The device of claim 11, further comprising a module to read the configuration pin settings of each CAN bus to determine an identification of the data concentrator from the configuration pin settings.

13. The device of claim 12, further comprising a user interface, the user interface comprising:
    features for controlling operation of the device; and
    a display for providing information related to the verification test, the information comprising an identification of the data concentrator associated with CAN bus on which the verification test is being performed and test results of the verification test.

14. The device of claim 11, wherein the verification test of a particular CAN bus further comprises:
    detecting a short circuit between a particular CAN high wire under test and an associated CAN low wire by the measurement circuit;
    detecting a short circuit between the particular CAN high wire under test and a ground potential by the measurement circuit; and
    detecting a short circuit between the associated CAN low wire and a ground potential by the measurement circuit, the particular CAN bus passing the verification test in response to not detecting any short circuits.

15. The device of claim 14, wherein the CAN bus is onboard an airplane and wherein detecting the short circuit between the particular CAN high wire under test and the associated CAN low wire comprises:
    connecting the associated CAN low wire to ground potential;
    removing any connection of the device to a ground of the airplane;
    connecting the particular CAN high wire to a voltage source of the device;
    measuring a voltage across a sense resistor associated with the particular CAN high wire;
    comparing the measured voltage to an expected voltage for the particular CAN high wire, the short circuit not being detected in response to the measured voltage corresponding substantially to the expected voltage.

16. The device of claim 14, wherein detecting the short circuit between the associated CAN low wire and ground comprises:
    connecting a ground of the device to a ground of an airplane;
    removing all connections to the particular CAN high wire;
    connecting the associated CAN low wire to a voltage source of the device;
    measuring a voltage across a sense resistor associated with the associated CAN low wire;

comparing the measured voltage to an expected voltage for the associated CAN low wire, the short circuit not being detected in response to the measured voltage corresponding substantially to the expected voltage.

17. The device of claim 14, wherein detecting the short circuit between the particular CAN high wire and ground comprises:
connecting a ground of the device to a ground of an airplane;
removing all connections to the associated CAN low wire;
connecting the particular CAN high wire to a voltage source of the device;
measuring a voltage across a sense resistor associated with the particular CAN high wire;
comparing the measured voltage to an expected voltage for the particular CAN high wire, the short circuit not being detected in response to the measured voltage corresponding substantially to the expected voltage.

18. A method for verifying wire integrity of a bus, comprising:
detecting connection to a bus connector, the bus connector being configured to connect a plurality of buses to an apparatus and each bus comprising a plurality of wires, wherein each bus comprises pin configuration settings;
reading the configuration pin settings of each bus and verifying that each bus is being connected to a valid or proper apparatus based on the configuration pin settings;
automatically performing a verification test of each bus, the verification test of each bus comprising:
connecting a wire under test in a predetermined configuration relative to the other wire by measurement circuitry for performing the verification test;
measuring a value of an electrical parameter associated with the wire under test; and
comparing the value of the measured electrical parameter associated with the wire under test to an expected value of the electrical parameter, the wire under test passing the verification test in response to the measured value of the electrical parameter corresponding substantially to the expected value of the electrical parameter.

19. The method of claim 18, further comprising reading the configuration pin settings of the bus connector to determine an identification of the apparatus from the configuration pin settings.

20. The method of claim 18, wherein the verification test comprises:
detecting a short circuit between the wire under test and another wire of the bus;
detecting a short circuit between the wire under test and a ground potential; and
indicating that the wire passed the verification test in response to not detecting the short circuit between the wire under test and the other wire of the bus and not detecting the short circuit between wire under test and the ground potential.

* * * * *